(12) United States Patent
Dawson et al.

(10) Patent No.: US 10,158,210 B2
(45) Date of Patent: *Dec. 18, 2018

(54) OPTICAL LOSS MANAGEMENT IN HIGH POWER DIODE LASER PACKAGES

(71) Applicant: nLIGHT Photonics Corporation, Vancouver, WA (US)

(72) Inventors: David C. Dawson, Vancouver, WA (US); Wolfram Urbanek, Camas, WA (US); David Martin Hemenway, Beaverton, OR (US)

(73) Assignee: nLIGHT, Inc., Vancouver, WA (US)

( * ) Notice: Subject to any disclaimer, the term of this patent is extended or adjusted under 35 U.S.C. 154(b) by 135 days.

This patent is subject to a terminal disclaimer.

(21) Appl. No.: 14/971,753

(22) Filed: Dec. 16, 2015

(65) Prior Publication Data

US 2016/0181762 A1 Jun. 23, 2016

Related U.S. Application Data

(60) Provisional application No. 62/093,322, filed on Dec. 17, 2014.

(51) Int. Cl.
*H01S 5/024* (2006.01)
*G02B 6/42* (2006.01)
(Continued)

(52) U.S. Cl.
CPC ............ *H01S 5/02469* (2013.01); *G02B 6/42* (2013.01); *H01S 5/02292* (2013.01); *H01S 5/02423* (2013.01); *H01S 5/4012* (2013.01)

(58) Field of Classification Search
CPC ............ H01S 5/02469; H01S 5/02423; H01S 5/02292; H01S 5/4012; G02B 6/42
See application file for complete search history.

(56) References Cited

U.S. PATENT DOCUMENTS 4,847,183 A * 7/1989 Kruger ............... G03F 7/00
257/E23.179
5,253,260 A 10/1993 Palombo
(Continued)

OTHER PUBLICATIONS

Price et al., "High Brightness Fiber Coupled Pump Laser Development," nLIGHT Photonics Corp., 7 pages, Jan. 30, 2010.

*Primary Examiner* — Xinning (Tom) Niu
(74) *Attorney, Agent, or Firm* — Klarquist Sparkman, LLP

(57) ABSTRACT

A high power diode laser module is provided with improved high temperature handling and reliability, the module including a housing made of a thermally conductive material and providing a module interior extending between a plurality of housing surfaces, at least one diode laser disposed in the module interior and situated to emit a laser beam, one or more optical components disposed in the module interior and coupled to the at least one diode laser so as to change one or more characteristics of the laser beam, a waveguide in optical communication with the module interior and situated to receive the laser beam from the one or more optical components, and an optical absorber disposed in the housing and situated to receive stray light which is associated with the laser beam and which is propagating in the module interior so as to absorb the stray light and conduct heat associated with the stray light away from the module interior and into the housing.

30 Claims, 6 Drawing Sheets

(51) Int. Cl.
 *H01S 5/40* (2006.01)
 *H01S 5/022* (2006.01)

(56) References Cited

U.S. PATENT DOCUMENTS

| | | | | |
|---|---|---|---|---|
| 5,408,559 | A | * | 4/1995 | Takahashi .............. G02B 6/422 |
| | | | | 385/89 |
| 5,848,083 | A | | 12/1998 | Haden et al. |
| 6,195,372 | B1 | | 2/2001 | Brown |
| 6,351,478 | B1 | | 2/2002 | Heberle |
| 8,824,049 | B2 | | 9/2014 | Chann et al. |
| 2003/0029232 | A1 | * | 2/2003 | Felix ................... G01N 17/043 |
| | | | | 73/86 |
| 2003/0067669 | A1 | * | 4/2003 | Sekiya ................... H01S 3/302 |
| | | | | 359/334 |
| 2007/0196951 | A1 | * | 8/2007 | Ma ....................... H01S 5/0206 |
| | | | | 438/106 |
| 2009/0084684 | A1 | * | 4/2009 | Kawamura ........... H05K 3/0038 |
| | | | | 205/655 |
| 2010/0158060 | A1 | * | 6/2010 | Faybishenko ........ G02B 6/4206 |
| | | | | 372/36 |
| 2010/0226655 | A1 | * | 9/2010 | Kim .................... G02B 6/4246 |
| | | | | 398/139 |

* cited by examiner

OPTICAL LOSS MANAGEMENT IN HIGH POWER DIODE LASER PACKAGES

CROSS-REFERENCE TO RELATED APPLICATION

This application claims the benefit of U.S. Provisional Patent Application No. 62/093,322 filed Dec. 17, 2014, which is incorporated by reference herein.

FIELD

The field is high power diode laser packages capable of generating 10 W or more of laser energy.

BACKGROUND

One efficiency measure in diode laser packages is the ratio of the amount of optical power emitted from one or more diode lasers and the amount of useful optical power that is output from the package. This optical to optical efficiency, even when maximized through optical design, is impaired by losses resulting in the formation of stray light inside the laser package. The loss typically ranges from a few percent to many tens of percent, depending on the complexity of the structure and optical coupling of a particular device. Laser diode package housings are often made of a thermally conductive material, such as copper or aluminum, which can serve to couple heat out of the package for convective or further conductive cooling. Complex water-based cooling systems can be integrated with one or more diode laser packages to provide package cooling, and are particularly relied upon to increase package lifetime as diode power or diode package power density increases.

In the art of laser packaging, mechanical structures and features are often highly reflective, for example, by being gold-plated or soldered. In virtually all packages, it has been found herein that stray laser light reflects off these internal package surfaces or structures, until it is finally absorbed into a surface. Features that are not highly reflective, and thus absorbing a proportionally larger percentage of light, include epoxies, diode laser thermal substrates, electrical insulating coatings, etc., each of which are often not intended or designed to be robust to laser light. Lower power packages in the industry are usually able to dissipate this heat as it is relatively low magnitude, without significant impact to epoxies, lasers or other structures, and so reflected light has been ignored. In higher power packages, such as packages generating 10 W to 300 W or more of laser energy, this results in 1 W to 300 W, or more, of stray light and therefore heat, which the inventors have found causes degradation of optical surfaces, such as coatings, and other internal components, such as epoxies. This stray light may also be absorbed into the laser diode or laser diode substrate, resulting in diode wavelength change, reduced diode lifetime, or laser instability. Heating of opto-mechanical structures within the package, including solder, epoxy, etc., can cause in optical misalignment, PIF (package induced failure) through outgassing, and result in premature laser, thermal, structural, or optical failure. Conventional packages typically address increased heat load with active cooling systems alone, which increases cost significantly. Accordingly, there remains a need for improvements to diode laser package heat management with fewer drawbacks.

SUMMARY

According to one embodiment, a high power diode laser module, includes a housing made of a thermally conductive material and providing a module interior extending between a plurality of housing surfaces, at least one diode laser disposed in the module interior and situated to emit a laser beam, one or more optical components disposed in the module interior and coupled to the at least one diode laser so as to change one or more characteristics of the laser beam, a waveguide in optical communication with the module interior and situated to receive the laser beam from the one or more optical components, and an optical absorber disposed in the housing and situated to receive stray light which is associated with the laser beam and which is propagating in the module interior so as to absorb the stray light and conduct heat associated with the stray light away from the module interior and into the housing.

According to another embodiment, a method for improving the thermal performance of a high power laser diode package, includes masking selected surfaces intended for optical absorption of stray light in the package interior so as to form selected masked surface locations therein, coating surfaces of the diode laser package, including the selected masked surface locations in the package interior, with a non-reactive solder base metal, removing the mask, and forming optical absorbers at the selected masked surface locations where the mask was removed by acid etching the surfaces of the diode laser package. According to a further method for improving the thermal performance of a high power laser diode package, surfaces of the diode laser package are coated with a solder or solder-like material, including surfaces where a stray light optical absorber is to be disposed, surfaces for masking are selected where the stray light optical absorber is not to be disposed, and absorptive coating is applied to the one or more surfaces of the diode laser package, the absorptive coating being disposed in the package for absorbing stray light propagating within the high power laser diode package, and the masked is removed.

According to a further embodiment, a stray light management system for a high power laser package capable of handling powers in excess of 100 W is provided, the laser package having multiple surfaces therein and a lid, and including a plurality of diode lasers configured to emit laser beams, optics for collimating and directing the laser beams, and an objective for focusing the collimated and directed beams, wherein stray light is created and not coupled out of the laser package through the objective, the stray light management system including a stray light absorbing block including an absorptive coating applied thereon, the stray light absorbing block positioned to receive stray light propagating with the laser package and to absorb the stray light, the stray light absorbing block also including a thermal path for channeling out of the laser package the heat generated by the absorbed stray light.

The foregoing and other objects, features, and advantages will become more apparent from the following detailed description, which proceeds with reference to the accompanying figures which are not necessarily drawn to scale.

DETAILED DESCRIPTION

As laser package power increases in the industry, stray light management will become an issue of increasing importance for the science of laser packaging, particularly for packages housing semiconductor laser diodes. While controlling optical losses, such as with improved designs or higher quality optical coatings for optical elements, can provide strategic reduction in expected optical loss which contributes to stray light, an accidental improper coating application, e.g., due to manufacturing tolerances, on a focusing lens, prism, or mirror can eliminate the loss benefit and impact reliability. Moreover, as advances in laser diode power arrive and as diode package power output increases, even control of losses cannot mitigate the effects of multiple to tens of Watts of stray light. Coating imperfections, bulk optical substrate imperfections, optical element imperfections, laser diode imperfections, impure polarizations, each can contribute to loss which can stack to detrimentally affect performance and reliability. While it may not be possible to control all losses, instead stray light can be managed by providing absorptive coatings or structures, or both, within the package in strategic locations. The absorptive coatings are operative to reduce the number of reflections for stray light and provide to an engineered thermal path for dumping the heat out of the package, greatly reducing the impact of stray light to package performance and reliability. Absorbed stray light which is re-emitted by the absorptive coatings tends to be shifted to a longer wavelength black body spectrum which can be less damaging to package components. Accordingly, diode packages can be made with higher reliability and with higher power ceilings than conventional modules. Moreover, with the improved stray light and heat management, a larger diode laser package power ceiling can be attained without requiring active cooling systems, such as coolant circulation systems, etc. Alternatively, the mean time to failure for packages across a wide range of power levels can be seen to increase without substantial additional expense. By combining the features herein with conventional methods, such as active cooling, additional heat dissipation can be achieved, resulting in improved performance and reduced cost for users in a host of applications.

Figure 1:
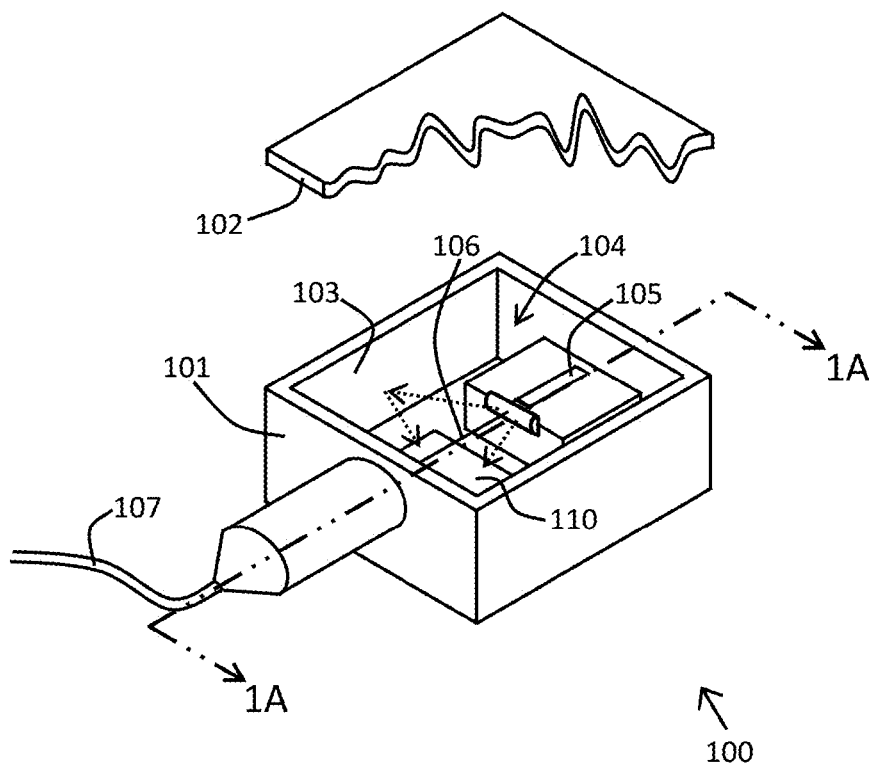
FIGS. 1-4 are perspective views of a laser diode packages.
Figure 1A:
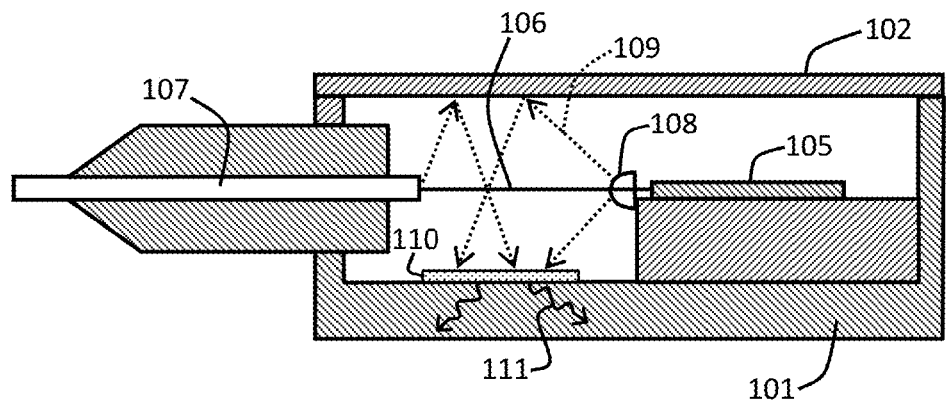

In FIG. 1 a diode laser module 100 utilizing stray light absorption techniques. The module 100 includes a housing 101 made of a conductive material such as copper. The housing 101 includes a lid 102 (shown substantially cut-away) and plurality of sides 103 which generally enclose a module interior 104 in which a laser diode 105 is situated for emission of a laser beam 106. The characteristics of the semiconductor laser diode 105, such as wavelength, power output, etc., can be selected as needed for the particular application. Wavelengths or wavelength ranges selected between about 640 nm and 1080 nm are generally suitable, though green, UV, and near IR can also be suitable in some examples. The laser beam 106 is directed to and coupled into a waveguide 107 such as an optical fiber which is in optical communication with the housing interior. FIG. 1A provides a side cross-sectional view of FIG. 1 so as to provide additional perspective on laser operation. During laser operation, the laser beam 106 can be coupled to one or more optical components, such as fast-axis collimation optic 108, in order to control or adjust one or more characteristics of the laser beam 106 in order to provide for optical coupling into the waveguide 107. It will be appreciated that in various module examples, other types of optical coupling components may be used.

In the process of emitting and coupling the beam 106 into the waveguide 107, non-coupled stray light (illustrated as dashed arrows 109) is generated. The stray light 107 tends to multiply reflect within the module interior 104 leading to operational and reliability problems for the module 100. A stray light absorber 110 is disposed in the module interior 104 and is operable to absorb the stray light 109 and conduct the associated heat (illustrated as wavy arrows 111) into the housing 101 for removal from the module 100. The removal of heat associated with stray light 109 reduces the overall temperature of the module 100 during laser operation leading to improved performance as compared to conventional modules without the stray light absorber 110. Absorber 110 can be disposed in the module interior in a variety of configurations. In some examples, the absorber 110 can be take the form of a coating disposed on all or selected surfaces of the module interior 104. Surfaces can be selected based on suitable thermal paths, relative positioning of reflective surfaces, proximity to optical components, as well as expected reflective, refractive, or diffractive stray light projections associated with the stray light interacting with different components and surfaces, or to satisfy other constraints.

Figure 2:
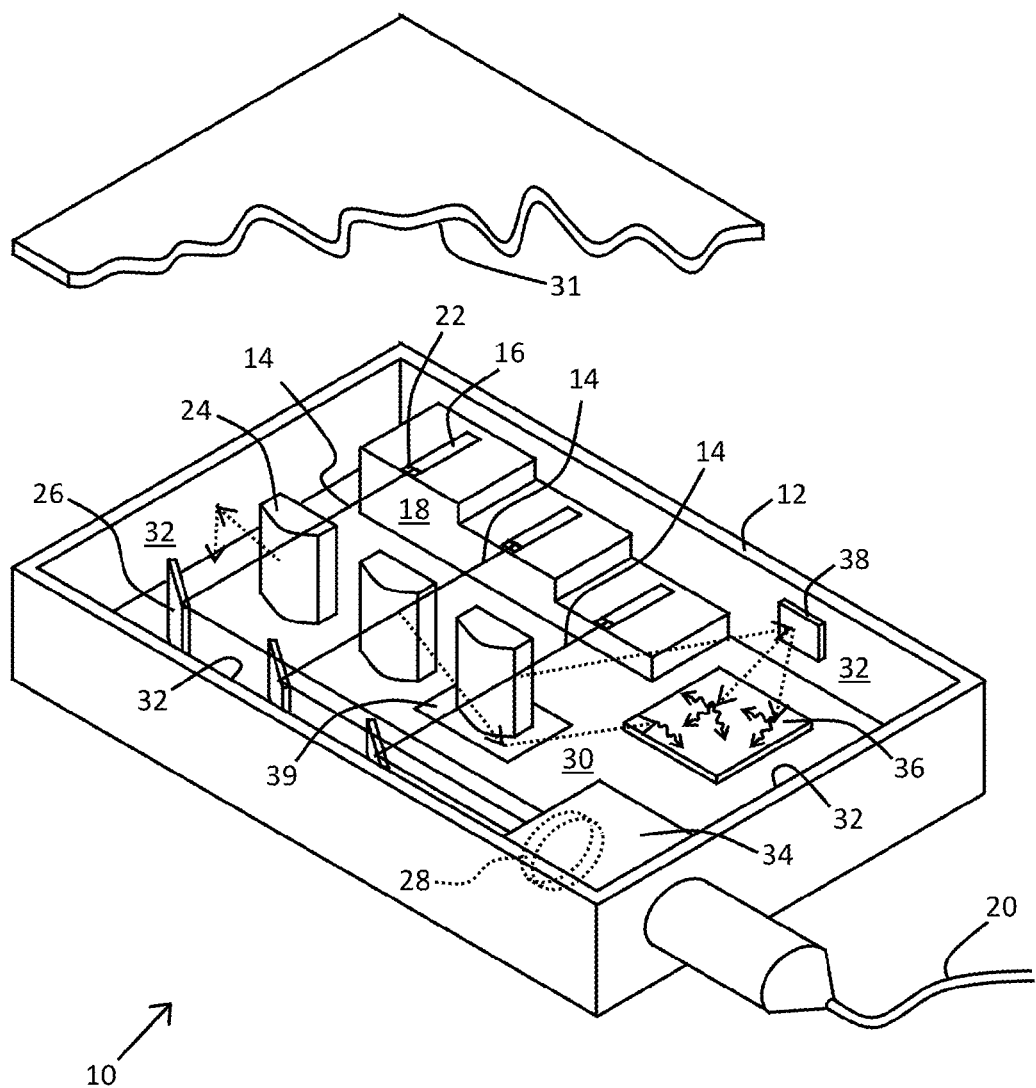

Referring to FIG. 2, there is shown an example of a high power diode laser package 10 with a lid 31 of a housing 12 removed to reveal the interior contents of the package. The package generates diode laser beams 14 from respective semiconductor diode lasers 16 situated in a stair step arrangement on a conductive diode laser block 18 and combines the beams 14 for coupling into an output optical fiber 20. The laser beams 14 are collimated by optical components disposed in the optical paths, such as fast collimation optics 22 and slow axis collimation optics 24. The collimated beams 14 are reflected with turning mirrors 26 at a right angle in-plane with the beams' slow axes into a stacked arrangement which is then coupled into the optical fiber 14 using an objective lens 28. In some examples, the collimated beams 14 are not fiber coupled and instead are reshaped or used with, e.g., free-space optics, for various applications, including solid state laser pumping, illumination, and direct diode systems.

The conductive diode laser block 18 is attached to a bottom surface 30 or one or more side surfaces 32 of the diode laser package 10 along with other conductive or metallic components. A lid 31 is secured to the housing to seal the package and its contents. The housing 12 is generally made of a thermally conductive material, such as copper, aluminum, ALN, kovar, CuW, MoCu, steel, or alloy thereof, providing superior heat conductive capabilities for the large amount of heat generated in the process of generating laser radiation, though other exemplary materials are possible. In some examples, the selected housing material has superior heat conductivity and a minimized coefficient of thermal expansion. In further examples, depending on total power output, the housing may be made from a steel allow, or similar allow with a low coefficient of thermal expansion. Diode lasers 16 are generally capable of emitting high power output beams, such as 2 W each, 5 W each, 10 W each, 12 W each, 15 W each, 20 W each, or more. In further examples, diode laser bars are used instead of single-emitter diode lasers as shown. It will be appreciated that a variety of diode laser package geometries and configurations are possible. Package output powers can be scaled to exceed 300 W by increasing the number of diode lasers, and by combining increased number of beams with a number of techniques, including but not limited to polarization and geometrical multiplexing. Increasing the number of diode chips and multiplexing the corresponding beams generally increase the amount of stray light as the additional optics required to combine the plurality of laser beams provides more opportunities for optical loss and scattering.

The slow axis collimation optics 24 and turning mirrors 26 can be secured to the bottom surface 30 using epoxy or solder. The objective lens 28 can be secured to the bottom surface 30 of the housing 12, or alternatively disposed in a thermally conductive ferrule housing 34, the housing 34 which can be soldered or fastened to the bottom or side housing surfaces 30, 32. An optical absorber 36 is disposed on the bottom surface 30 and is situated to receive stray light rays (shown symbolically as dashed arrows) which are formed in the process of coupling the laser beams 14 through the various optical components in the package.

In some examples, the optical absorber 36 is a coating selectively applied to the conductive bottom surface 30 of the housing 12, though other surfaces of the package can be selected for application. Suitable regions selected for coating are able to safely absorb the light and carry away the resulting heat without detrimentally affecting the performance or reliability of the device. Optical absorber coatings may be applied in various selected regions using optically absorptive materials, which typically have reflectivities less than 45%. Examples of optically absorptive materials include absorptive high temperature paint containing ceramic particulates in a binder such as carbides, nitrides, silicates, or other particulates within a solution cured to a dried state. This liquid solution could be an organic or inorganic polymer, or some combination thereof. Further examples can include boron nitride, aluminum nitride, silicon carbide, titanium oxide, tungsten oxide, nickel oxide, and variants thereof, as well as other oxides. In some examples, optical absorber coatings can include inks which may contain one or more of the aforementioned materials contained in a carrier solvent. In additional examples, optically absorptive coatings can include salts created through solvent evaporation or concentration coagulation, such as copper phosphate. Other methods of depositing coatings can include electro-chemical methods, such as plating or electrophoretic painting.

Some embodiments of package 10 can include scattering elements 38 disposed selectively in the package 10. Scattering elements 38 can be situated to control the specular reflections in areas of high irradiance or fluence, such as behind mirrors, diode high reflectors (e.g., typically diode rear facets), in proximity to surfaces to which optical elements are secured, so as to provide a more dispersed scatter of stray light within the package. Other areas for scattering elements 38 can include in proximity to polarization multiplexers, geometric multiplexers, edges of optical elements, or any area not well-coupled. The dispersed stray light can then be captured with optical absorbers. For example, in some embodiments various surfaces internal to the diode package, such as housing surfaces 30, 32, mounting block 18 surfaces, etc., as well as optical absorber surfaces, can have the reflective attributes tailored to be specular or diffuse by providing the surface with a degree of smoothness or roughness. Roughness tailoring mechanisms can include polishing, sanding, chemical etching, application of a film, etc. In some examples, scattering elements 38 can include a reflective surface such as ground glass or a reflective ceramic with fine matrix, such as $Al_2O_3$ or BeO. In further examples, scattering elements 38 can be intermixed with optical absorber 36 or optical absorber 36 can include scattering element features. In some examples, surfaces are smooth but unpolished.

In some embodiments of package 10, highly reflective elements 39, e.g., highly reflective at laser wavelengths, can be disposed in proximity to components or in areas where heating through absorption should be minimized, such as lenses, semiconductor lasers, epoxies, or coatings. By using the highly reflective elements 39, heating caused within or near heat-sensitive areas, such as near an epoxied optic or laser diode by way of example, can be minimized, while areas for absorption can then be located away from the heat-sensitive features. Highly reflective elements can include housing base-metal of suitable reflectivity as well as specular metallic materials or applications of films.

Figure 3:
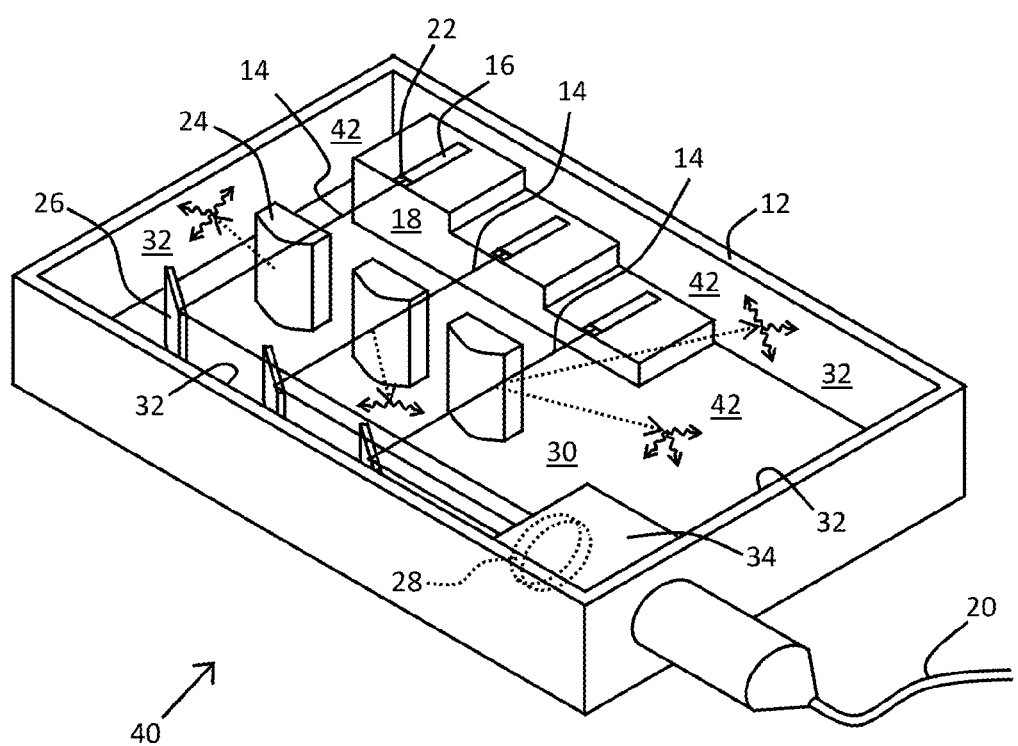

In FIG. 3 another example of a high power diode laser package 40 is shown. Package 40 can include similar optical components and package features as shown for package 10 or it can include various other combinations of optical components and package features forming other possible diode laser package configurations. However, package 40 includes an optical absorber coating 42 applied to each of the exposed housing surfaces, which are bottom surface 30 and side surfaces 32 in FIG. 3. In some examples, before mounting block 18 and other package components are installed in the package, the housing is coated with the optical absorber coating 42. Alternatively, selected surfaces of the package are masked off and the optical absorber coating 42 is selectively applied such that the masked surfaces are protected from the application of the absorber coating 42. Masked surfaces can include locations where various package components are to be secured. For example, in order to solder or secure components to other components or directly to the housing, it is often required that internal bonding surfaces remain highly reflective. In other examples, epoxied components are secured to a non-metallic surface to promote adhesion. Masked surfaces can also include locations where the underlying surface is intended to be left specular, partially specular, or is made specular with an additional coating or treatment, so as to provide a predictable location for reflection. Portions of optical absorber 42 can be situated in communication with the specular regions for receiving the specular reflections from the specular regions. Some locations which are masked so as not to have optical absorber coating applied to the locations can include surfaces in proximity to or underlying components or areas where heating through absorption should be avoided in order to minimize heating of the component or component bond.

Figure 4:
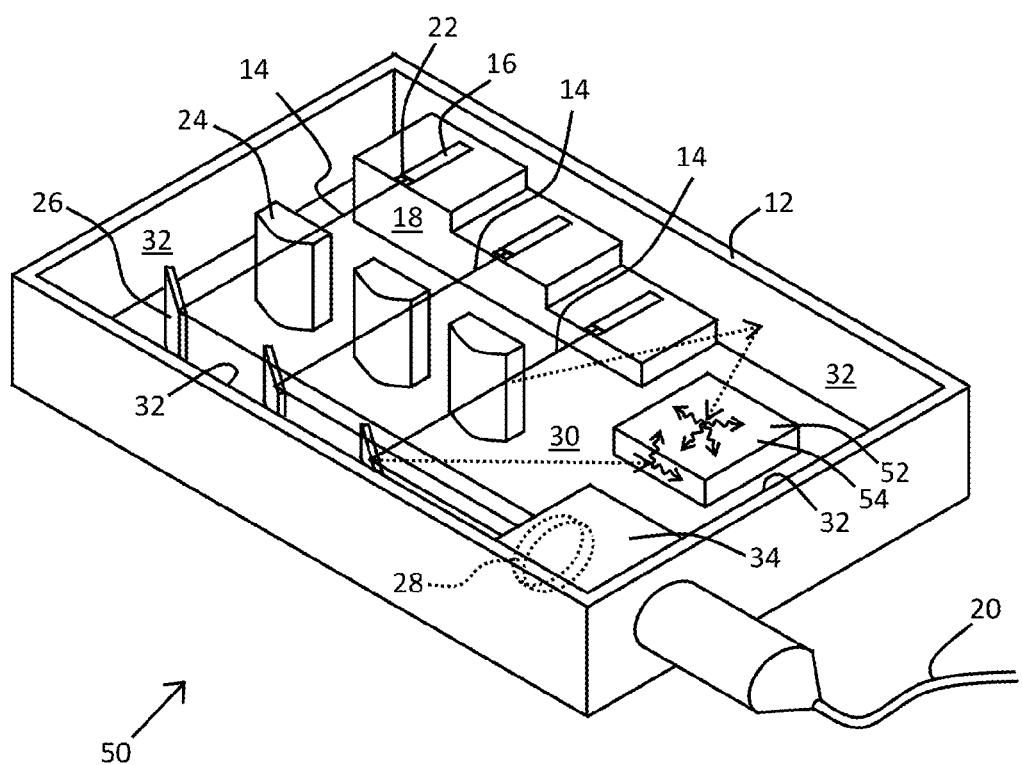

In FIG. 4, another example of a high power diode laser package 50 is shown. Package 50 can include similar optical components and package features as shown for package 10. However, package 50 also includes an optical absorber structure 52 situated in the package 50 for providing an absorptive target for stray light that is generated (indicated generally with dashed arrows). The structure 52 is coated on selected portions or on its entire exposed surface with an optically absorptive coating 54 configured to absorb the stray light reflecting off various surfaces in the interior cavity of the package 50. In some examples, structure 52 forms an integrated part of package 50 and is made from the same material which has a high optical absorptivity and thermal conductivity. Structures 52 can be bonded to the housing 12, or to other suitable elements within the package, with solders, brazing, fasteners, or other thermally conductive materials. The structure 52 can be an integrated feature of the housing 12 or other element within the package. In some examples, the structure 52 is coupled to the bottom surface 30 of the housing 12 due to the efficient heat conduction path through the bottom of the package.

Herein, optical absorber coatings can include a variety of materials with suitable absorption properties for laser light, including for light at the wavelength emitted by the diode lasers as well as other light that can become back-coupled into the package. Coatings can have thicknesses in the range of nm to µm or more, depending on the material composition or formation method. Coatings can include oxides of an underlying base metal or deposited layer. For example, for a package housing 12 made of copper, the interior surfaces of the package housing 12 can be processed so as to form a copper oxide coating on the interior surfaces which can be suitable as an optical absorber in some embodiments. In one example, with further reference to FIG. 5, for a package housing 12 made of copper, an oxidative metallic layer can be formed on the package housing 12 using a metal selected for its absorption properties when oxidized, such as nickel. A layer of non-reactive metal, such as gold, can be selectively formed over the metallic layer which is masked to protect surface portions suitable for optical absorption of stray light. After the non-reactive metal is applied, the mask is removed and an oxidation process is applied to the package, such as with nitric acid, which oxidizes the nickel to enhance its stray-light absorption attributes and leaves the non-reactive metal layer intact. The resulting oxidized layer is a type of nickel oxide, such as NiO or $Ni_2O_3$. In a further example, the oxidative metallic layer is instead the underlying base metal, such as copper. The resulting oxidized layer is copper oxide, such as CuO or $Cu_2O$.

In additional examples, the structure 52 of package 50 can be a liquid-cooled water block constructed from a material with a high thermal conductivity which can be coated with an optically absorptive material, or a heat pipe manufactured from a material with a high thermal conductivity. The liquid-cooled water block or heat pipe can be attached to the base 30 or walls 32 of the package 50 with a low thermal impedance interface to maximize heat removal from the package.

Figures 5A, 5B:
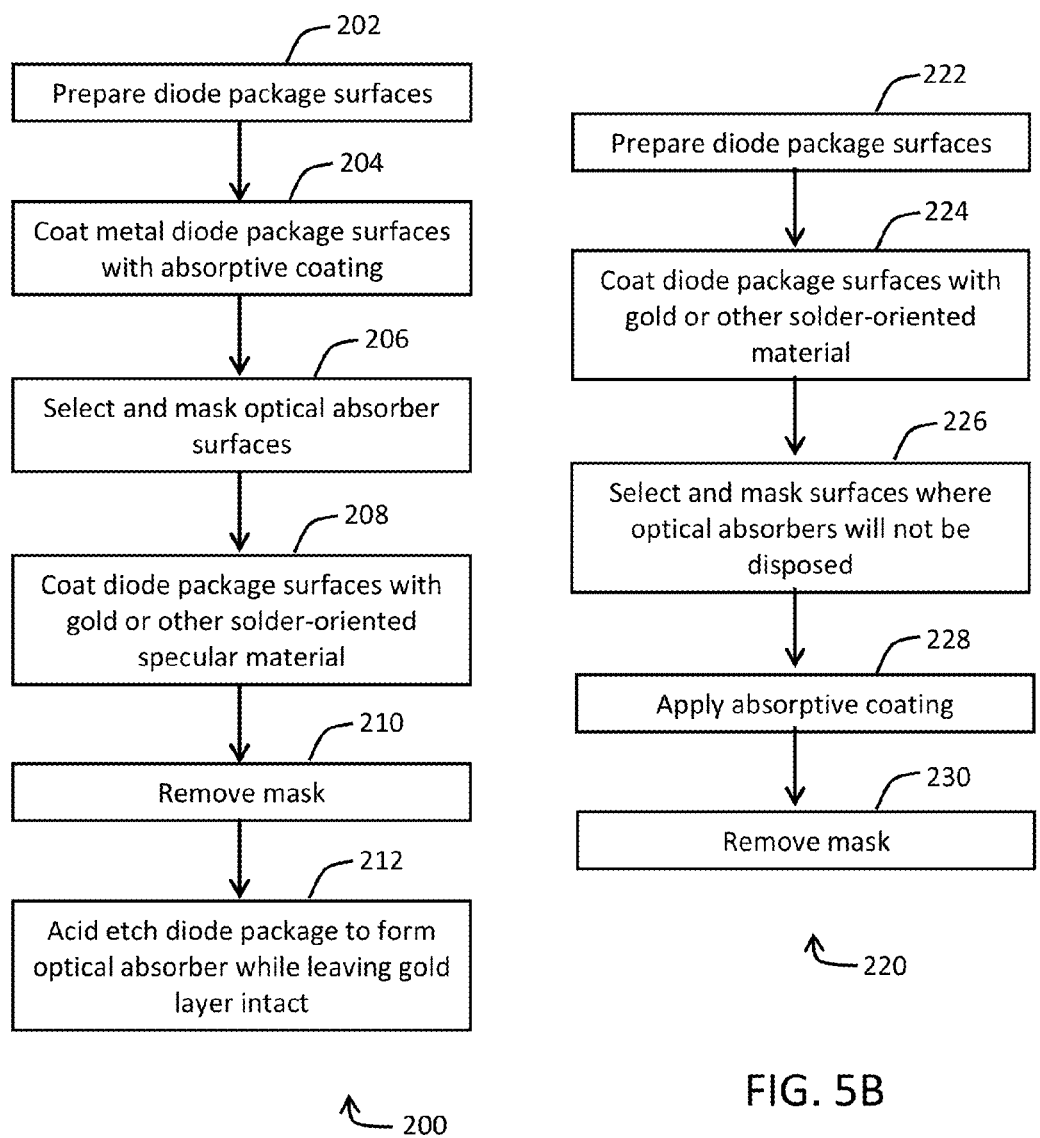
FIGS. 5A and 5B are flowcharts of example methods.

Referring now to FIG. 5A, a flowchart is shown for an example method 200 of forming an optical absorber on a high power diode module. At 202, surfaces of the diode package are prepared for coating application. At 204, some or all metal surfaces of the module are coated with an absorptive coating or material, such as an oxidizable metal, with nickel being just one example, or a nitride or phosphate. Base materials can be applied prior to application of the absorptive coating, or other steps as needed. At 206, surfaces are selected for masking where optical absorber coating is to be applied and then those surfaces are masked. At 208, surfaces of the module, including the aforementioned surfaces for optical absorber positioning, are coated with a non-reactive specular base metal or other material, such as gold. After coating the surfaces, the mask is removed at 210 and then a chemical process, such as an acid etch, is subsequently performed at 212 on the surfaces which forms the optical absorbers at the selected surface locations while leaving the non-reactive specular base metal intact. In further examples, an oxidizable metal is not applied at step 204 and the underlying base metal is subject to material transformation, such as by acid etch, at the selected masked surfaces.

Depending on the base metal of the module or depending on the selected oxidizable metal that is applied, or both, oxide optical absorbers are formed at the selected masked locations. The type of optical absorber that is formed can depend on which coatings are applied or not applied and what type of etch or material processing step is performed to the coatings or underlying base metal. In FIG. 5B, another example method 220 is shown with a flowchart depiction. High power diode module surfaces are prepared at 222 for coating application. At 224, surfaces of the diode module, including the housing, sides, lid, mounting blocks, etc., are coated with gold, nickel, or another metallic material. In some examples, the metallic material is a solder or a solder-like metallic material. At 226, surfaces are selected and masked where optical absorbers are not be disposed in the module interior. At 228, an absorptive coating, such as a high-temperature paint or other non-metallic compound such as a ceramic, is applied and at 230 the mask is removed.

Figure 6:
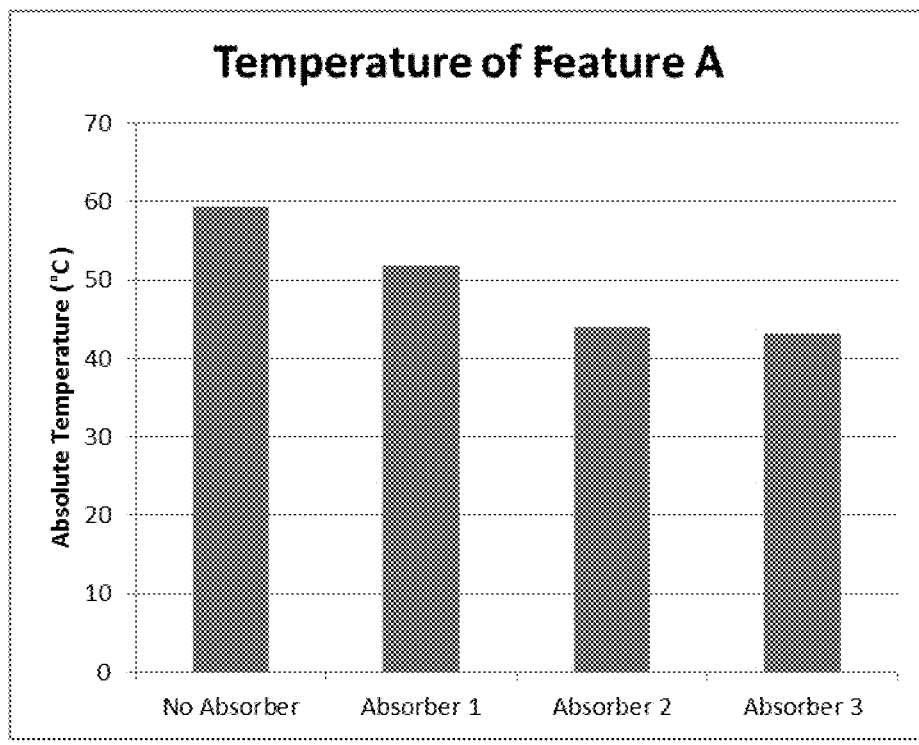
FIG. 6 is a bar chart comparing thermal performance for different laser diode package embodiments.

FIG. 6 is a chart showing temperature performance test data for three laser diode package embodiments, designated 'Absorber 1', 'Absorber 2', and 'Absorber 3', using optical absorber elements as described herein, and a fourth embodiment that does not use an optical absorber element, designated as 'No Absorber'. The tested diode laser packages had similar construction, each having eighteen diode lasers (three per mounting block) emitting respective 12 W laser beams which were coupled into an output optical fiber. For Absorber 1, a separate mounting block used for mounting a trio of diode lasers was disposed in the package cavity without diode lasers secured being secured to the separate block. Instead the separate mounting block was coated with an optically absorbing high temperature black paint on surfaces exposed to the interior of the package cavity. The coated mounting block for Absorber 1 was secured in a suitable location within the housing without interfering with the coupling of the beams. For Absorber 2, the same coated mounting block was used but at a different position within the package cavity where it was determined to be a region of high light intensity. For Absorber 3, a 2 cm wide×9 cm long portion of the package lid interior surface was coated instead of a mounting block. Each of the absorbers was operable to absorb stray reflected light within the packages. The temperature within the package was measured on a thermally and electrically conductive block used to electrically connect different banks of diode lasers. As can be concluded from the chart, the optical absorbers examples herein reduce the temperature of the package in which they are disposed, which leads to increased package reliability and reduced cost.

In view of the many possible embodiments to which the principles of the disclosed technology may be applied, it should be recognized that the illustrated embodiments are only representative examples and should not be taken as limiting the scope of the disclosure. Alternatives specifically addressed in these sections are merely exemplary and do not constitute all possible alternatives to the embodiments described herein. For instance, various components of systems described herein may be combined in function and use. We therefore claim all that comes within the scope and spirit of the appended claims.

We claim:

1. A high power diode laser module, comprising:
    a housing made of a thermally conductive material and providing a module interior extending between a plurality of housing surfaces;
    a diode laser disposed in the module interior and situated to emit a laser beam;
    one or more optical components disposed in the module interior and coupled to the diode laser beam so as to change one or more characteristics of the laser beam;
    a waveguide in optical communication with the module interior and situated to receive the laser beam from the one or more optical components; and
    an optical absorber corresponding to one or more coatings applied to at least one of the housing surfaces and situated to reduce a temperature of the high power diode laser module during operation, the optical absorber situated in the housing to receive stray light that is produced through the generation of the laser beam and coupling of the laser beam out of the package and that is propagating in the module interior, wherein the optical absorber is configured to absorb the stray light and to conduct heat associated with the stray light away from the module interior and into the housing to increase a power ceiling and/or mean time to failure reliability of the high power diode laser module.

2. The module of claim 1, wherein the optical absorber is a nickel oxide coating.

3. The module of claim 1, wherein the optical absorber is a coating selected from the group consisting of boron nitride, aluminum nitride, silicon carbide, titanium oxide, nickel oxide, tungsten oxide, or copper phosphate.

4. The module of claim 1, wherein the optical absorber includes one or more of the housing surfaces as oxidized housing surfaces.

5. The module of claim 4, wherein the housing is made of copper and the optical absorber is copper oxide.

6. The module of claim 4, wherein the one or more optical absorber housing surfaces includes an oxidized nickel layer.

7. The module of claim 1, wherein the diode laser is operable to emit 10 W or more of diode laser light.

8. The module of claim 1, wherein the diode laser comprises a plurality of diode lasers operable to emit corresponding laser beams, and wherein the laser beams are polarization multiplexed.

9. The module of claim 1, wherein the one or more optical components includes:
collimation optics coupled to the laser beam so as to provide fast and slow axis collimation associated with the laser beam;
turning optics situated to change the direction of the laser beam; and
focusing optics situated to focus the laser beam into the waveguide.

10. A method, comprising:
masking selected surfaces of a laser diode package intended for optical absorption of stray light in the package interior so as to form selected masked surface locations;
coating surfaces of the diode laser package, including the selected masked surface locations in the package interior, with a non-reactive solder base metal;
removing the mask; and
forming optical absorbers at the selected masked surface locations where the mask was removed by acid etching the surfaces of the diode laser package.

11. The method of claim 10, further comprising coating the surfaces of the laser diode package with an absorptive material before masking to form the selected masked surface locations.

12. The method of claim 11, wherein the absorptive material is a nitride or phosphate.

13. The method of claim 11, wherein the absorptive material is an oxidizable metal.

14. The method of claim 13, wherein the oxidizable metal is nickel.

15. The method of claim 10, wherein the selected surfaces for masking are copper surfaces of the package and wherein the formed optical absorbers are made of copper oxide or copper phosphate.

16. The method of claim 10, wherein the optical absorbers are situated to provide an thermal path directing waste heat away from sensitive components.

17. A method, comprising:
coating surfaces of a diode laser package with a solder or solder-like material, including surfaces where a stray light optical absorber is to be situated;
masking selected surfaces where the stray light optical absorber is not to be situated;
applying an absorptive coating to the surfaces of the diode laser package, the absorptive coating situated to absorb stray light propagating within the diode laser package; and
removing the mask.

18. The method of claim 17, wherein the absorptive coating is high temperature paint, ceramic, or non-metallic compound.

19. A stray light management system for a laser package capable of handling powers in excess of 10 W, the laser package having multiple surfaces in a laser package interior and a lid, and including a plurality of diode lasers situated to emit laser beams, optics for collimating and directing the laser beams, and an objective for focusing the collimated and directed beams, wherein stray light is created and not coupled out of the laser package through the objective, the stray light management system comprising:
a stray light absorbing block configured to increase a power ceiling during operation and/or a mean time to failure of the laser package with an absorptive coating applied to surfaces of the stray light absorbing block that are positioned to receive stray light propagating within the laser package and to absorb the stray light, the stray light absorbing block also including a thermal path for coupling out of the laser package the heat generated by the absorbed stray light.

20. The stray light management system of claim 19, further comprising a scattering element situated to receive stray light in the laser package and to scatter the stray light into the cavity to be absorbed by the stray light absorbing block.

21. The stray light management system of claim 20, wherein the scattering element is situated to receive specular reflections of high intensity light.

22. The stray light management system of claim 19, wherein the stray light absorbing block forms an integral part of the laser package.

23. The stray light management system of claim 19, wherein selected surfaces of the laser package are situated to specularly reflect stray light such that the stray light is directed to the stray light absorbing block.

24. The stray light management system of claim 23, further comprising a scattering element situated to receive the specular reflection of stray light and to scatter the stray light into the cavity to be absorbed by the stray light absorbing block.

25. The stray light management system of claim 23, wherein the selected surfaces are smooth but unpolished.

26. The stray light management system of claim 19, wherein selected surfaces of the laser package provide a diffuse reflection to stray light by being treated chemically or physically to have a roughness feature.

27. The stray light management system of claim 19, wherein the absorptive coating is selected from the group consisting of absorptive high temperature paint, ceramic particulates in a binder, an ink in a carrier solvent, or a combination thereof.

28. The stray light management system of claim 27, wherein the binder is selected from the group consisting of carbons, boron nitrides, aluminum nitride, silicon carbides, or titanium oxides, or a combination thereof.

29. The stray light management system of claim 19, wherein the stray light absorbing block is the interior surface of the lid of the laser package.

30. The stray light management system of claim 19, wherein the diode lasers emit at a wavelength between about 640 nm and about 1080 nm.

* * * * *

UNITED STATES PATENT AND TRADEMARK OFFICE
CERTIFICATE OF CORRECTION

PATENT NO. : 10,158,210 B2
APPLICATION NO. : 14/971753
DATED : December 18, 2018
INVENTOR(S) : Dawson et al.

Page 1 of 1

It is certified that error appears in the above-identified patent and that said Letters Patent is hereby corrected as shown below:

On the Title Page

Item (*) Notice: Subject to any disclaimer, the term of this patent is extended or adjusted under 35 U.S.C. 154(B) by 135 days.
This patent is subject to a terminal disclaimer."
Should read:
--(*) Notice: Subject to any disclaimer, the term of this patent is extended or adjusted under 35 U.S.C. 154(B) by 135 days.--

Item (45) "Date of Patent: *Dec. 18, 2018"
Should read:
--Date of Patent: Dec. 18, 2018--

In the Claims

Column 9, Line 66, Claim 16:
"provide an thermal path"
Should read:
--provide a thermal path--

Signed and Sealed this
Sixth Day of August, 2019

Andrei Iancu
*Director of the United States Patent and Trademark Office*